United States Patent
Chen et al.

(10) Patent No.: US 10,729,033 B1
(45) Date of Patent: Jul. 28, 2020

(54) ACTIVE HEAT-DISSIPATION SYSTEM AND CONTROLLING METHOD THEREOF

(71) Applicant: National Chung-Shan Institute of Science and Technology, Taoyuan (TW)

(72) Inventors: Yen-Bin Chen, New Taipei (TW); Sheng-Hsien Shih, Nantou County (TW); Shou-Jen Hsu, Hsinchu (TW); Chien-Te Yu, Taoyuan (TW)

(73) Assignee: National Chung-Shan Institute of Science and Technology, Taoyuan (TW)

( * ) Notice: Subject to any disclaimer, the term of this patent is extended or adjusted under 35 U.S.C. 154(b) by 0 days.

(21) Appl. No.: 16/430,434

(22) Filed: Jun. 4, 2019

(30) Foreign Application Priority Data

Mar. 14, 2019 (TW) .............................. 108109013 A

(51) Int. Cl.
| H05K 7/20 | (2006.01) |
| G01K 7/34 | (2006.01) |
| G06N 3/04 | (2006.01) |

(52) U.S. Cl.
CPC .............. *H05K 7/20* (2013.01); *G01K 7/346* (2013.01); *G06N 3/0436* (2013.01);
(Continued)

(58) Field of Classification Search
CPC .. H05K 7/20; H05K 7/20209; H05K 7/20281; H05K 7/20381; H05K 7/207;
(Continued)

(56) References Cited

U.S. PATENT DOCUMENTS

| 5,655,375 A | 8/1997 | Ju |
| 6,207,936 B1 | 3/2001 | de Waard |

(Continued)

FOREIGN PATENT DOCUMENTS

| CN | 101140450 A | 3/2008 |
| JP | H08-159542 A | 6/1996 |

(Continued)

OTHER PUBLICATIONS

R. Ashino et al., Wavelet basics and their applications to neural neworks—toward learning and adapting under nonstationary environment, Proceedings of the 47th Annual Conference of the Institute of Systems, Control and Information Engineers (ISCIE), May 14-16, 2003, pp. 451-456, Kyoto.

(Continued)

*Primary Examiner* — Jacob R Crum
(74) *Attorney, Agent, or Firm* — Winston Hsu

(57) ABSTRACT

An active heat-dissipation system for a base station of a communication system includes a measuring module, configured to detect a temperature sensing signal of the base station; a controller, configured to receive the temperature sensing signal detected by the measuring module to set a preset temperature signal, to generate a difference between the temperature sensing signal and the preset temperature signal and a time derivative of the difference, and to output a control signal according to the difference and the time derivative of the difference based on a control program; and a power module, configured to receive the control signal and output an electrical signal to a heat-dissipation module according to the control signal, such that the heat-dissipation module performs a heat-dissipation process for the base station according to the electrical signal.

13 Claims, 3 Drawing Sheets

(52) U.S. Cl.
CPC ..... *H05K 7/20209* (2013.01); *G01K 2217/00* (2013.01); *H05K 7/207* (2013.01); *H05K 7/20281* (2013.01); *H05K 7/20381* (2013.01); *H05K 7/20836* (2013.01)

(58) Field of Classification Search
CPC ........... H05K 7/20836; H05K 7/20945; G01K 7/346; G01K 2217/00; G06N 3/0436
See application file for complete search history.

(56) References Cited

U.S. PATENT DOCUMENTS

| | | | | |
|---|---|---|---|---|
| 2004/0133350 | A1* | 7/2004 | Veneruso | G01V 1/36 702/6 |
| 2006/0222045 | A1* | 10/2006 | Byquist | G06F 1/206 374/109 |
| 2010/0085196 | A1* | 4/2010 | Stiver | H05K 7/20836 340/584 |
| 2013/0090889 | A1* | 4/2013 | Vaidyanathan | G01K 1/024 702/136 |
| 2013/0158738 | A1 | 6/2013 | Chen | |
| 2013/0340994 | A1* | 12/2013 | David | F28F 27/00 165/287 |
| 2015/0156917 | A1* | 6/2015 | Ogawa | H05K 7/207 361/695 |

FOREIGN PATENT DOCUMENTS

| | | |
|---|---|---|
| JP | H08-286550 A | 11/1996 |
| JP | 2018-106561 A | 7/2018 |
| JP | 2018-519557 A | 7/2018 |
| WO | 2014/037988 A1 | 3/2014 |

OTHER PUBLICATIONS

Kunikazu Kobayashi et al., A Wavelet Neural Network with Network Optimizing Function, the Institute of Electronics, Information and Communication Engineers (IEICE), Oct., 1994, pp. 2121-2129, vol. J77-D-II No. 10.

* cited by examiner

ACTIVE HEAT-DISSIPATION SYSTEM AND CONTROLLING METHOD THEREOF

BACKGROUND OF THE INVENTION

1. Field of the Invention

The present disclosure relates to a heat-dissipation system, and more particularly, to an active heat-dissipation system and controlling method thereof.

2. Description of the Prior Art

With the trend of improving efficiency of base stations of a communication system and minimizing sizes of the base stations, many high-efficiency chips or electronic elements are required to operate in a narrow and enclosed space, which causes a poor heat-dissipation effect and may lead to failure of the heat dissipation of the high-efficiency chips or electronic elements. Most of the base stations of the conventional communication system are implemented indoors and only few of them are implemented outdoors. A conventional heat-dissipation method for the indoor base stations is cooling down the environment temperature by air conditioners, and transporting the cool air to the electronic elements inside the base stations by forced convection. A conventional heat-dissipation method for the outdoor base stations is placing air conditioners nearby the base stations, and introducing the cool air via pipes from the air conditioners to the base stations.

The conventional heat-dissipation methods for the base stations mainly utilize the air conditioners to cool down surrounding temperature where the base stations locate, and guide the cold air to heating elements through a natural convection or the forced convection. However, the cold air exhausted by the air conditioner is first mixed with the air of surroundings and then undergoes the heat-dissipation for heat sources, which cannot effectively cool down the heat sources with the coldest air exhausted from the air conditioner for the heat-dissipation. Therefore, the present disclosure provides a smart control system which cooperates with a heat-dissipation module to improve the efficiency to solve the problems when the chips of the base stations are confined in the narrow and enclosed space.

SUMMARY OF THE INVENTION

Therefore, the present disclosure provides an active heat-dissipation system and controlling method thereof to solve the heat-dissipation problems and the disadvantages of the prior art.

An embodiment of the present disclosure discloses an active heat-dissipation system for a base station of a communication system, comprising a measuring module, configured to detect a temperature sensing signal of the base station; a controller, configured to receive the temperature sensing signal detected by the measuring module to set a preset temperature signal, to generate a difference between the temperature sensing signal and the preset temperature signal and a time derivative of the difference, and to output a control signal according to the difference and the time derivative of the difference based on a control program; and a power module, configured to receive the control signal and output an electrical signal to a heat-dissipation module according to the control signal, such that the heat-dissipation module performs a heat-dissipation process for the base station according to the electrical signal.

Preferably, the controller further comprises a calculation unit, a voltage/current input/output interface and a temperature captured interface.

Preferably, the controller is configured to simultaneously receive, process and output at least one difference between the temperature sensing signal and the preset temperature signal and at least one time derivative of the difference.

Preferably, the heat-dissipation module further comprises a cooling plate, a vapor chamber, a fan and a heat pipe.

Preferably, the controller, the measuring module, the base station and the communication system are electrically connected to each other, and the heat-dissipation module is electrically connected to the communication system for cooling down the communication system.

Preferably, the control program is an adaptive wavelet neural network (AWNN) algorithm for determining the difference between the temperature sensing signal and the preset temperature signal and the time derivative of the difference.

Preferably, the control program is an adaptive fuzzy control algorithm for determining the difference between the temperature sensing signal and the preset temperature signal and the time derivative of the difference according to a time-variant temperature measured by the measuring module.

Another embodiment of the present disclosure discloses a temperature controlling method, for an active heat-dissipation system, wherein the temperature controlling method comprising detecting, by a measuring module, a temperature sensing signal of the base station of a communication system; receiving, by a controller, the detected temperature sensing signal to set a preset temperature signal; generating, by the controller, a difference between the temperature sensing signal and the preset temperature signal and a time derivative of the difference; outputting, by the controller, a control signal according to the difference and the time derivative of the difference based on a control program; outputting, by a power module, an electrical signal to a heat-dissipation module according to the control signal; and performing, by the heat-dissipation module, a heat-dissipation process for the base station according to the electrical signal.

Preferably, the controller further comprises a calculation unit, a voltage/current input/output interface and a temperature captured interface.

Preferably, the controller is configured to simultaneously receive, process and output at least one difference between the temperature sensing signal and the preset temperature signal and at least one time derivative of the difference.

Preferably, the heat-dissipation module further comprises a cooling plate, a vapor chamber, a fan and a heat pipe.

Preferably, the control program is an adaptive wavelet neural network (AWNN) algorithm for determining the difference between the temperature sensing signal and the preset temperature signal and the time derivative of the difference.

Preferably, the control program is an adaptive fuzzy control algorithm for determining the difference between the temperature sensing signal and the preset temperature signal and the time derivative of the difference according to a time-variant temperature measured by the measuring module.

These and other objectives of the present invention will no doubt become obvious to those of ordinary skill in the art after reading the following detailed description of the preferred embodiment that is illustrated in the various figures and drawings.

DETAILED DESCRIPTION

The below are implementations according to specific embodiments of the present disclosure, and those skilled in the art may understand advantages and effects of the present disclosure by the disclosed description.

Figure 1:
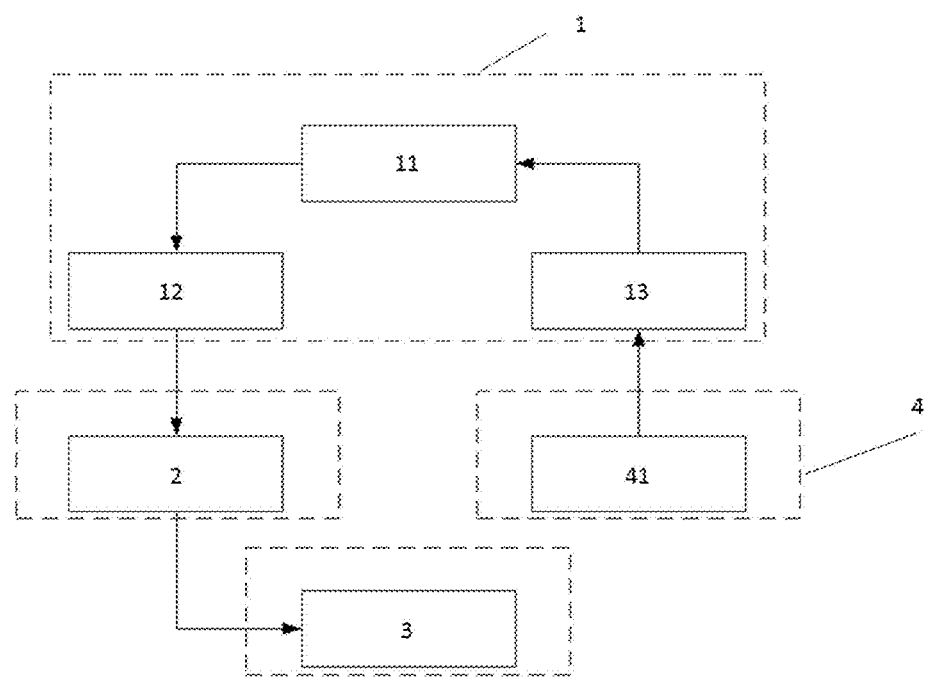
FIG. 1 is a schematic diagram of an active heat-dissipation system according to an embodiment of the present disclosure.

Please refer to FIG. 1, which is a schematic diagram of an active heat-dissipation system 10 according to an embodiment of the present disclosure. The active heat-dissipation system 10 may be applied on a communication system and includes a controller 1, a power module 2, a heat-dissipation module 3 and a measuring module 4. The controller 1 includes a calculation unit 11, a voltage/current input/output interface 12 and a temperature captured interface 13. The calculation unit 11 is configured to operate a control program, e.g. a wavelet neural network (WNN) algorithm or an adaptive fuzzy control algorithm. The controller 1 is enabled to adaptively derive a fuzzy rule according to an adaptive rule by self-learning to obtain a better control response by the calculation unit 11 of the WNN algorithm or the adaptive fuzzy control algorithm, such that a characteristic of temperature convergence is rapidly achieved through the better control response of the active heat-dissipation system 10. The voltage/current input/output interface 12 is configured to receive a control signal outputted from the calculation unit 11, and then output the received control signal to the power module 2. The temperature captured interface 13 is configured to receive a temperature sensing signal measured by the measuring module 4 of the communication system and transmit the temperature sensing signal to the calculation unit 11.

After the power module 2 of the active heat-dissipation system 10 receives the control signal from the voltage/current input/output interface 12, the power module 2 transforms the received control signal into an electrical signal and outputs the electrical signal to the heat-dissipation module 3. The electrical signal corresponds to the power/current. The heat-dissipation module 3 includes a cooling plate, a variable fan, a heat pipe and a vapor chamber. An end of the vapor chamber is connected to heating elements to evenly introduce heat generated by the heating elements to the vapor chamber by a conduction method. Another end of the vapor chamber is connected to a low-temperature surface of the cooling plate, such that a heat exchange is performed between the vapor chamber and the cooling plate. A high-temperature surface of the cooling plate is connected to the heat pipe, such that the heat is conducted from a heat-absorption part of the heat pipe to a heat-dissipation part of the heat-pipe.

In another preferable embodiment, the controller 1 is configured to receive the temperature sensing signal sensed by the measuring module 4 for setting a preset temperature signal, and to generate a difference between the temperature sensing signal and the preset temperature signal and a time derivative of the difference. The controller 1 is configured to output the control signal according to the difference and the time derivative of the difference based on the control program, wherein the control program may be the AWNN algorithm for processing the difference and the time derivative of the difference, or the control program may be the adaptive fuzzy control algorithm for processing the difference and the time derivative of the difference according to a time-variant temperature measured by the measuring module 4. In addition, the controller 1 may simultaneously receive, process and output at least one difference between the temperature sensing signal and the preset temperature signal and at least one time derivative of the difference.

Figure 2:
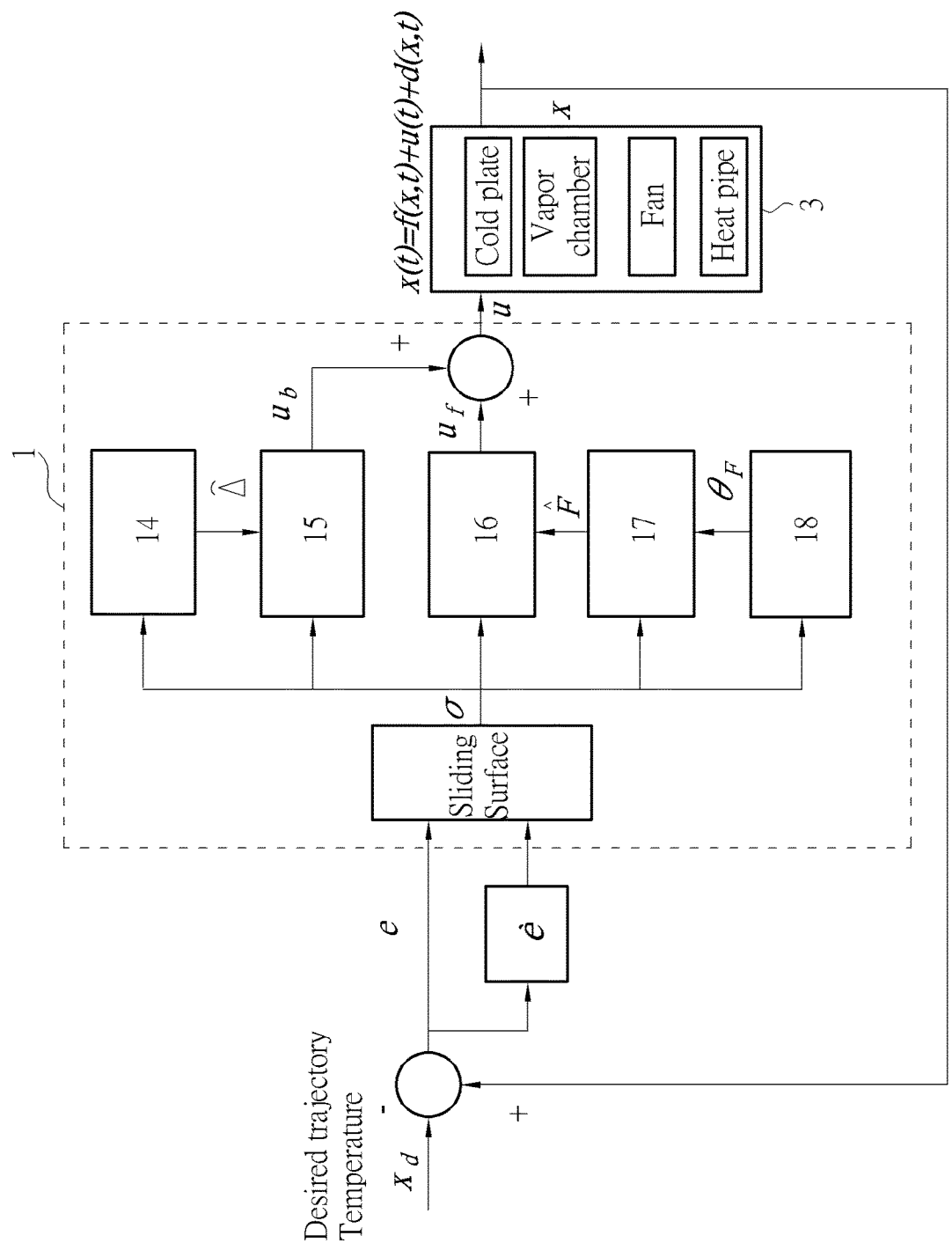
FIG. 2 is a schematic diagram of a control loop of an adaptive fuzzy control according to an embodiment of the present disclosure.

Please refer to FIG. 2, which is a schematic diagram of a control loop of an adaptive fuzzy control based on FIG. 1. The controller 1 is configured to obtain better control response derived from the fuzzy rule according to the adaptive rule of self-learning, such that the characteristic of temperature convergence is rapidly achieved through the control response of the active heat-dissipation system 10. The controller 1 receives a preset or expected temperature value ($x_d$) based on an operational method of the adaptive fuzzy control algorithm, and the preset or expected temperature value ($x_d$) is subtracted by the temperature value (x) sensed by the temperature sensor 41 of the measuring module 4 to obtain e(t), and a formula of e(t) is:

$$e(t)=x_d(t)-x(t)$$

Then, a steady-state sliding surface is formed by the subtracted value (e) and its derivative (ė), and a control signal σ(t) is generated by the sliding surface, a formula of σ(t) is:

$$\sigma(t)=\dot{e}(t)-ke(t)$$

Then, the control signal σ(t) generated by the sliding surface may be outputted to the controller 1. In this embodiment, the controller 1 may include an equivalent controller 14, a collision controller 15, an adaptive fuzzy system (AFS) 16, a fuzzy controller 17 and an online adaptation controller 18, wherein $\lambda_1$, $\lambda_2$ and $\lambda_3$ are learning speeds.

The equivalent controller 14 defines a first upper boundary and a first lower boundary, which respectively exist a first fixed difference with the sliding surface, according to the received control signal e(t) generated by the sliding surface, wherein the first upper boundary and the first lower boundary are utilized for filtering the control signals outside the sliding surface, and the control signals outside the first boundaries of the sliding surface are neglected. Based on the control signal of the sliding surface, control signals within the first upper boundary and the first lower boundary are estimated based on the adaptive rules to generate an estimated value ($\hat{\Delta}$), a formula of the estimated value ($\hat{\Delta}$) is:

$$\hat{\Delta}=r|\sigma(t)|$$

Then, the collision controller 15 defines a second upper boundary and a second lower boundary, which respectively exist a second fixed difference with the sliding surface, according to the received control signal e(t) generated by the sliding surface, wherein the second upper boundary is larger than the first upper boundary defined by the equivalent controller 14, and the second lower boundary is smaller than the first lower boundary defined by the equivalent controller 14. The collision controller 15 filters the control signals outside the sliding surface with the second upper boundary and the second lower boundary, and the control signals outside the second boundaries of the sliding surface are neglected. The collision controller 15 applies the control signals within the second upper boundary and the second lower boundary on the adaptive rules, which is based on the control signal of the sliding surface and the estimated value of the equivalent controller 14, to generate a first control input ($u_b$), which maintains a system track on the sliding surface, and the a formula of the first control input ($u_b$) is:

$$u_b = -\xi_F \hat{A} \text{sgn}(\sigma(t))$$

Then, the online adaptation controller 18 defines a sudden upper boundary and a sudden lower boundary, which respectively exist a third fixed difference with the sliding surface, according to online control signal ($\sigma$) of the sliding surface. The online adaptation controller 18 filters the control signals outside the sliding surface with the sudden upper boundary and the sudden lower boundary, the control signals outside the sudden boundaries of the sliding surface are neglected, and the signals ($\theta_F$) within the sudden upper boundary and the sudden lower boundary are transmitted to the fuzzy controller 17. The fuzzy control rule of the fuzzy controller 17 is listed in Table 1, where P is positive, N is negative and Z is zero.

TABLE 1

| Output u | e (error) First control input | | |
|---|---|---|---|
| | P | Z | N |
| ė (derivative of error) Second control input | P | P | P | N |
| | Z | P | Z | N |
| | N | P | N | N |

The signals within the sudden upper boundary and the sudden lower boundary are determined to generate a fuzzy control output signal ($\hat{F}$), which is transmitted to an AFS controller 16, and the AFS controller 16 estimates a second control input ($u_f$) by the universal approximation theorem after receiving the fuzzy control output signal ($\hat{F}$). A formula of the second control input ($u_f$) is:

$$u*(\sigma, \hat{F}(x \mid \theta_F)) = \frac{\sum_{i=1}^{M} \hat{F} \times \left( \prod_{i=1}^{n} \mu_{\hat{F}_i^j}(\sigma_i) \right)}{\sum_{i=1}^{M} \hat{F} \times \left( \prod_{i=1}^{n} \mu_{\hat{F}_i^j}(\sigma_i) \right)} = \hat{F}(x \mid \theta_F)^T \xi_F(\sigma)$$

The second control input ($u_f$) is a main input of the controller 1, and the first control input ($u_b$) is mainly configured to accelerate a convergence speed of the control signal of the active heat-dissipation system to a control point. After the controller 1 adds the first control input ($u_b$) and the second control input ($u_f$), a final control output (u) of the controller 1 is obtained. And a formula of the final control output (u) of the controller 1 is:

$$u(t) = u_f(t) + u_b(t)$$

The final control output (u) of the controller 1 enables to change a state of the heat-dissipation module 3. The controller 1 is mainly composed of the equivalent controller 14, the collision controller 15, the AFS 16, the fuzzy controller 17 and the online adaptation controller 18, but not limited thereto. In another embodiment, the present disclosure may include the equivalent controller 14 and the collision controller 15 to achieve the same control function. In other embodiments, a of combination of the equivalent controller 14, the collision controller 15, the AFS 16 and the fuzzy controller 17, or a combination of the equivalent controller 14, the collision controller 15, the AFS 16 and the online adaptation controller 18 may achieve the same control function with the controller 1.

Figure 3:
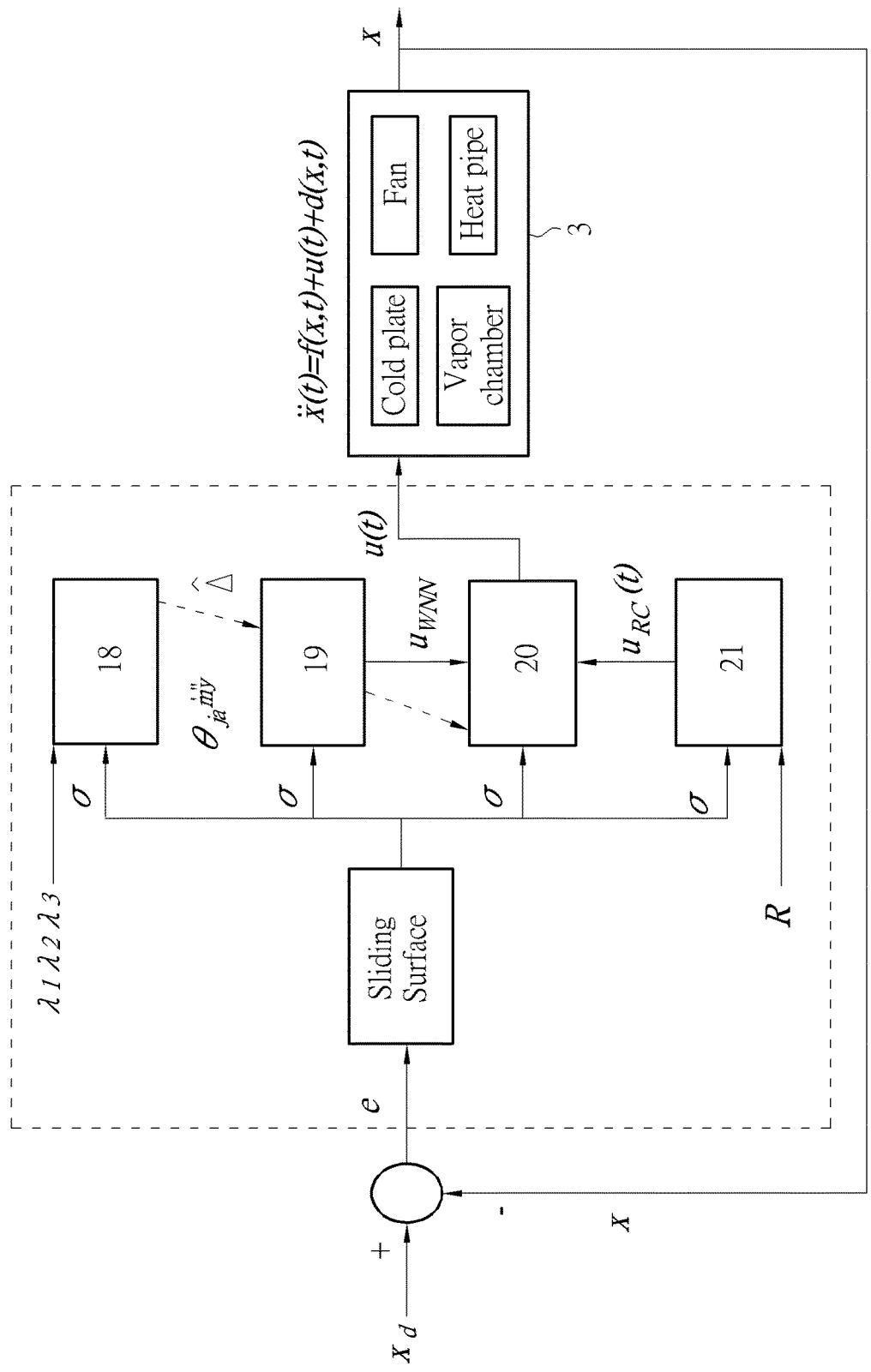
FIG. 3 is a schematic diagram of a control loop of an adaptive wavelet neural network according to an embodiment of the present disclosure.

Please refer to FIG. 3, which is a schematic diagram of a control loop of an adaptive wavelet neural network (AWNN) based on the active heat-dissipation system of FIG. 1. The AWNN includes a sliding surface, an online adaptation controller 18, a wavelet neural network (WNN) controller 19, an adaptive wavelet neural network (AWNN) controller 20 and a robust compensator 21. The controller 1 receives a preset or expected temperature value ($x_d$) based on an operational method of the AWNN algorithm, and the preset or expected temperature value ($x_d$) is subtracted by the temperature value (x) sensed by the temperature sensor 41 of the active heat-dissipation system to obtain e(t), and a formula of e(t) is:

$$e(t) = x_d(t) - x(t)$$

Then, a steady-state sliding surface is formed by the subtracted value (e) and its derivative (ė), and a control signal $\sigma(t)$ is generated by the sliding surface, a formula of $\sigma(t)$ is:

$$\sigma(t) = \dot{e}(t) - ke(t)$$

Then, the control signal $\sigma(t)$ generated by the sliding surface may be outputted to the controller 1. In this embodiment, the controller 1 may include the online adaptation controller 18, the WNN controller 19, the AWNN controller 20 and the robust compensator 21.

Therefore, the online adaptation controller 18 defines weighting values ($\theta_{jo}$) of each neuron between the wavelets in the wavelet neural network according to the control signal $\sigma(t)$ generated by the online sliding surface, and the weighting values ($\theta_{jo}$) are outputted to the WNN controller 19. The WNN controller 19 adjusts the control signal $\sigma(t)$ based on the weighting values ($\theta_{jo}$) of each neuron between the wavelets in the wavelet neural network, and the adjusted control signal ($u_{WNN}$) is a main control signal, which is outputted to the AWNN controller 20, and a formula of the control signal ($u_{WNN}$) is:

$$u_{WNNo} = \sum_{j=1}^{np} \theta_{jo} y_j^{(3)}(x_i^{(1)}, c_{ij}, v_{ij})$$

And then, the AWNN controller 20 receives the control signal ($u_{WNN}$) after weighted and the robust compensated signal ($u_{RC}$) from the robust compensator 21, wherein the robust compensated signal ($u_{RC}$) is obtained by calculating a difference between the control signal of the sliding surface and the sliding face according to a weighting R. A formula of the robust compensated signal ($u_{RC}$) is:

$$u_{RC}(t) = (2R^2)^{-1}(R^2+I)\sigma(t)$$

The robust compensated signal ($u_{RC}$) provides a control force to the system to maintain a system track of the sliding surface when a difference value exists between the control signal of the sliding surface and the sliding surface. Then, after the AWNN controller 20 receives the control signal ($u_{WNN}$), which is adjusted by weighting, and the robust compensated signal ($u_{RC}$), the control signal ($u_{WNN}$) and the robust compensated signal ($u_{RC}$) are added to output a final control signal (u(t)) of the controller 1 of the WWN to the heat-dissipation module 3, so as to change the state of the heat-dissipation module 3. After the heat-dissipation module 3 receives the final control signal (u or (u(t))) from the controller 1, the heat-dissipation module 3 changes operating states of the fan or the cooling plate according to the control signal, such that the heat-dissipation efficiency or the temperature of the communication system is varied with time and location. The temperature sensor 41 feeds back the temperature sensing signal to the heat-dissipation module 3 during the operation, such that the controller 1 may calculate and adjust the output control signal based on the temperature sensing signal.

In one of the embodiments of the temperature controlling method of the present disclosure, the received temperature sensing signals may be derived from more than one signal source of the system. For example, the active heat-dissipation system of the present disclosure includes more than one temperature sensor 41 to feedback more than one temperature sensing signal from more than one location, which are taken as inputs for the controlling method. In another embodiment of the present disclosure, the controlling method may include more than one output control signal to be respectively transmitted to more than one heat-dissipation module 3. For example, the active heat-dissipation system may include more than one cooling plate or variable fan, and these heat-dissipation elements may be controlled by the same controlling method, and not limited thereto.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An active heat-dissipation system for a base station of a communication system, comprising:
   a measuring module, configured to detect a temperature sensing signal of the base station;
   a controller, configured to receive the temperature sensing signal detected by the measuring module to set a preset temperature signal, to generate a difference between the temperature sensing signal and the preset temperature signal and a time derivative of the difference, and to output a control signal according to the difference and the time derivative of the difference based on a control program; and
   a power module, configured to receive the control signal and output an electrical signal to a heat-dissipation module according to the control signal, such that the heat-dissipation module performs a heat-dissipation process for the base station according to the electrical signal.

2. The active heat-dissipation system of claim 1, wherein the controller further comprises a calculation unit, a voltage/current input/output interface and a temperature captured interface.

3. The active heat-dissipation system of claim 1, wherein the controller is configured to simultaneously receive, process and output at least one difference between the temperature sensing signal and the preset temperature signal and at least one time derivative of the difference.

4. The active heat-dissipation system of claim 1, wherein the heat-dissipation module further comprises a cooling plate, a vapor chamber, a fan and a heat pipe.

5. The active heat-dissipation system of claim 1, wherein the controller, the measuring module, the base station and the communication system are electrically connected to each other, and the heat-dissipation module is electrically connected to the communication system for cooling down the communication system.

6. The active heat-dissipation system of claim 1, wherein the control program is an adaptive wavelet neural network (AWNN) algorithm for determining the difference between the temperature sensing signal and the preset temperature signal and the time derivative of the difference.

7. The active heat-dissipation system of claim 1, wherein the control program is an adaptive fuzzy control algorithm for determining the difference between the temperature sensing signal and the preset temperature signal and the time derivative of the difference according to a time-variant temperature measured by the measuring module.

8. A temperature controlling method, for an active heat-dissipation system, wherein the temperature controlling method comprises:
   detecting, by a measuring module, a temperature sensing signal of the base station of a communication system;
   receiving, by a controller, the detected temperature sensing signal to set a preset temperature signal;
   generating, by the controller, a difference between the temperature sensing signal and the preset temperature signal and a time derivative of the difference;
   outputting, by the controller, a control signal according to the difference and the time derivative of the difference based on a control program;
   outputting, by a power module, an electrical signal to a heat-dissipation module according to the control signal; and
   performing, by the heat-dissipation module, a heat-dissipation process for the base station according to the electrical signal.

9. The temperature controlling method of claim 8, wherein the controller further comprises a calculation unit, a voltage/current input/output interface and a temperature captured interface.

10. The temperature controlling method of claim 8, wherein the controller is configured to simultaneously receive, process and output at least one difference between the temperature sensing signal and the preset temperature signal and at least one time derivative of the difference.

11. The temperature controlling method of claim 8, wherein the heat-dissipation module further comprises a cooling plate, a vapor chamber, a fan and a heat pipe.

12. The temperature controlling method of claim 8, wherein the control program is an adaptive wavelet neural network (AWNN) algorithm for determining the difference between the temperature sensing signal and the preset temperature signal and the time derivative of the difference.

13. The temperature controlling method of claim 8, wherein the control program is an adaptive fuzzy control algorithm for determining the difference between the temperature sensing signal and the preset temperature signal and the time derivative of the difference according to a time-variant temperature measured by the measuring module.

* * * * *